United States Patent
Im et al.

(10) Patent No.: US 6,891,259 B2
(45) Date of Patent: May 10, 2005

(54) SEMICONDUCTOR PACKAGE HAVING DAM AND METHOD FOR FABRICATING THE SAME

(75) Inventors: Yun-Hyeok Im, Seoul (KR); Young-Hoon Ro, Chungcheongnam-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 2 days.

(21) Appl. No.: 10/646,444

(22) Filed: Aug. 21, 2003

(65) Prior Publication Data

US 2004/0036183 A1 Feb. 26, 2004

Related U.S. Application Data

(62) Division of application No. 10/271,094, filed on Oct. 10, 2002, now abandoned.

(30) Foreign Application Priority Data

Nov. 3, 2001 (KR) ........................................ 2001-68360

(51) Int. Cl.[7] ........................ H01L 23/22; H01L 23/24; H01L 23/34; H01L 23/28
(52) U.S. Cl. ...................... 257/687; 257/796; 257/719; 257/732; 257/717
(58) Field of Search ................................ 257/796, 732, 257/731, 719, 667, 687, 717, 787, 701, 702

(56) References Cited

U.S. PATENT DOCUMENTS

| | | | | |
|---|---|---|---|---|
| 4,801,998 A | * | 1/1989 | Okuaki | 257/681 |
| 5,518,660 A | | 5/1996 | Wei et al. | |
| 5,796,582 A | * | 8/1998 | Katchmar | 361/704 |
| 5,909,056 A | | 6/1999 | Mertel | |
| 6,278,182 B1 | * | 8/2001 | Liu et al. | 257/712 |
| 6,282,096 B1 | * | 8/2001 | Lo et al. | 361/704 |
| 6,317,326 B1 | | 11/2001 | Vogel et al. | |
| 6,369,380 B1 | * | 4/2002 | Hirai | 250/239 |
| 6,392,890 B1 | * | 5/2002 | Katchmar | 361/705 |
| 6,407,461 B1 | * | 6/2002 | Farquhar et al. | 257/787 |
| 6,515,360 B2 | * | 2/2003 | Matsushima et al. | 257/704 |
| 6,535,388 B1 | | 3/2003 | Garcia | |
| 6,549,407 B1 | | 4/2003 | Saucuic et al. | |
| 6,603,183 B1 | * | 8/2003 | Hoffman | 257/434 |
| 6,654,248 B1 | * | 11/2003 | Fishley et al. | 361/704 |
| 2002/0185748 A1 | * | 12/2002 | Akram et al. | 257/778 |
| 2003/0183909 A1 | * | 10/2003 | Chiu | 257/667 |

FOREIGN PATENT DOCUMENTS

| | | | | |
|---|---|---|---|---|
| JP | 0582672 | * | 9/1991 | 23/28 |
| KR | 1997-039212 | | 8/1997 | |
| KR | 1994-023007 | | 12/1998 | |

OTHER PUBLICATIONS

English language of Korean Patent Publication No. 1994-023007.
English language of Korean Patent Publication No. 1997-039212.

* cited by examiner

*Primary Examiner*—Nathan J. Flynn
*Assistant Examiner*—Victor A. Mandala, Jr.
(74) *Attorney, Agent, or Firm*—Marger, Johnson & McCollom PC

(57) ABSTRACT

A semiconductor package including a dam and a method for fabricating the same are provided. The semiconductor package comprises a package substrate, a semiconductor chip attached to the substrate, a TIM formed on the semiconductor chip, a dam that substantially surrounds the TIM, and a lid placed over the TIM to contact a surface thereof. Thus, a TIM can be prevented from flowing down from the original position at high temperatures. Therefore, the performance of the semiconductor package does not deteriorate even at high temperatures.

5 Claims, 6 Drawing Sheets

SEMICONDUCTOR PACKAGE HAVING DAM AND METHOD FOR FABRICATING THE SAME

This application is a divisional of U.S. patent application Ser. No. 10/271,094 filed on Oct. 10, 2002, now abandoned, which is herein incorporated by reference in it's entirety.

BACKGROUND OF THE INVENTION

1. Field of the Invention

The present invention relates to a semiconductor package and a method for fabricating the same, and more particularly, to a semiconductor package including a thermal interface material (TIM) and a method for fabricating the same.

2. Description of the Related Art

It is essential for semiconductor packages for microprocessors and power semiconductor modules to transfer the heat generated during their operation sufficiently to the outside to prevent the degradation of the semiconductor chips.

For this purpose, a thermal interface material (TIM) is typically installed between a semiconductor chip and a lid or between a lid and a heat sink in a semiconductor package. A phase change material (PCM), which is one of the TIM, has excellent heat conductivity and interfacial adhesive strength. The PCM, however, has a defect in that it changes into a liquid state at a high temperature, e.g., above 60° C. That is, the PCM melts and does not function as the TIM at a high temperature, thereby deteriorating the performance of semiconductor packages.

Figure 1:
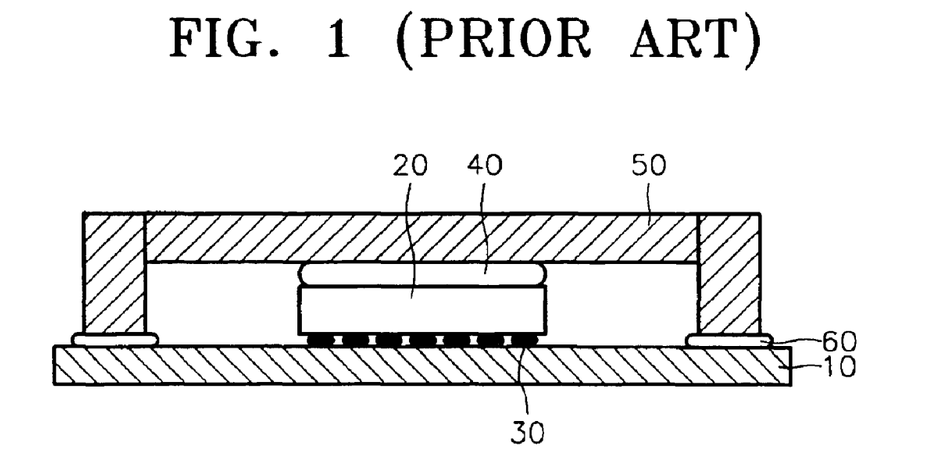
FIG. 1 is a cross-sectional view for explaining the structure of thermal interface material (TIM) of a conventional semiconductor package.

FIG. 1 is a cross-sectional view of the structure of a TIM of a conventional semiconductor package. Referring to FIG. 1, a semiconductor chip 20 is attached to a substrate 10 via bumps 30, and a TIM 40, which is a PCM, is formed on the semiconductor chip 20. Then, a lid 50 is attached to the substrate 10 via a sealant 60, thus encapsulating the semiconductor chip 20. The TIM 40 transmits heat generated from the semiconductor chip 20 to the lid 50, and vice versa because it maintains a solid shape below a predetermined temperature. However, at high temperatures, the TIM 40 is liquefied and then flows away from the original position of the TIM 40. Thus, the TIM 40 loses its inherent functions such as heat conductivity and interfacial adhesive strength.

Figure 2:
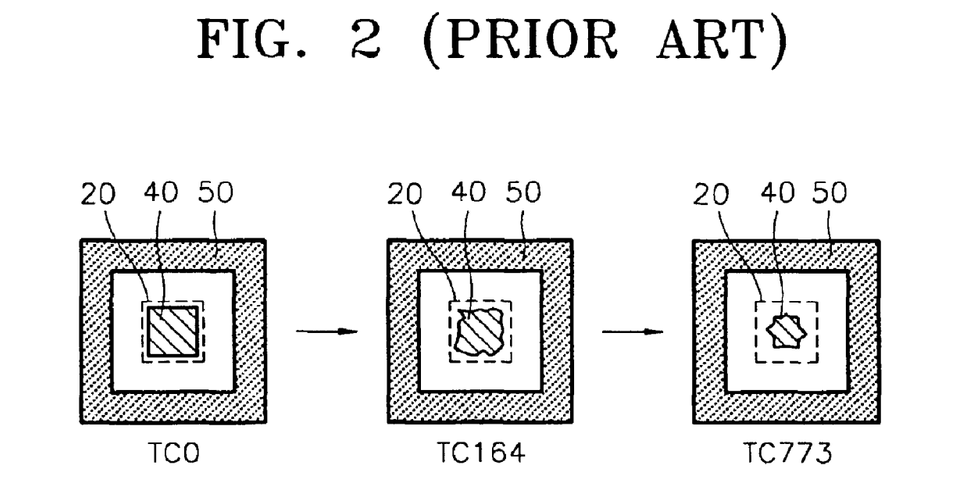
FIG. 2 are plan views for explaining changes in the shape of a TIM 40 when a temperature cycling test is performed on a conventional semiconductor package.

FIG. 2 includes plan views for explaining changes in the shape of the TIM 40 when a temperature cycling test is performed on a conventional semiconductor package. Referring to FIG. 2, the temperature cycling test is one of many reliability tests that test how much a semiconductor package deteriorates due to heat by repeatedly placing the semiconductor packages at −55° C. and 125° C. for a predetermined time, respectively.

FIG. 2 includes, on the left side, a plan view of a semiconductor package prior to performing the temperature cycling test thereon, taken by an ultra-sonograph. Here, it should be noted that there is no change in the shape of the TIM 40 disposed between the semiconductor chip 20 and the lid 50.

On the center of FIG. 2 is shown a plan view of the semiconductor package on which the temperature cycling test (during which the semiconductor packages are placed at −55° C. and 125° C. for a predetermined time) was performed about 164 times. At this time, about 30% of the TIM 40 is liquefied and flows away.

On the right is shown a plan view of each of the semiconductor packages on which the temperature cycling test (during which the semiconductor packages are placed at −55° C. and 125° C. for a predetermined time) was performed about 773 times. At this time, only about 40% of the TIM 40 remains.

SUMMARY OF THE INVENTION

According to one embodiment of the present invention, a semiconductor package includes a substrate, a semiconductor chip attached to the substrate via bumps, a TIM attached to the top of the semiconductor chip, a dam that contacts the TIM and prevents the TIM from flowing down the semiconductor chip at high temperatures, and a lid that contacts the top of the TIM and being attached to the substrate and seals up the semiconductor chip and the dam.

According to another embodiment, a semiconductor package includes a substrate; a semiconductor chip attached to the substrate via bumps; a TIM attached to the top of the semiconductor chip, a lid that contacts the top of the TIM and attached to the substrate via a sealant, seals up the semiconductor chip and dam, and has square-shaped grooves at its bottom; and a dam being formed along the outline of the grooves of the lid and being in contact with the TIM.

According to yet another embodiment of the present invention, a method for fabricating a semiconductor package includes preparing a substrate; attaching a semiconductor chip to the substrate; forming a dam on the resultant structure having the semiconductor chip so as to prevent a TIM from being melting and flowing down the semiconductor chip; forming the TIM on the semiconductor chip; and attaching a lid to the substrate so that the TIM and the dam are in contact with the bottom of the lid. Here, forming the TIM may be performed prior to forming the dam.

According to still another embodiment of the present invention, a method for fabricating a semiconductor package, includes preparing a substrate a substrate; attaching a semiconductor chip including bumps to the substrate; attaching a lid to the substrate, wherein the lid has a supporter and injection holes to which a liquid metal that are required to form a dam and a TIM is injected; injecting a liquid material that is required to form the dam to the injection holes of the lid; and injecting a liquid material that is required to form the TIM to the injection holes.

Here, a liquid material that is required to form the TIM may be injected to the injection holes before injecting a liquid material that is required to form the dam to the injection holes of the lid.

To achieve yet another aspect of the present invention, a method for fabricating a semiconductor package, includes: preparing a substrate having a land at its bottom and bump connectors at its top as a frame; attaching a semiconductor chip including bumps to the substrate; forming a TIM on the semiconductor chip; processing a lid to have square-shaped grooves at its bottom such that portions of the TIM and semiconductor chip are inserted into the grooves; inserting a dam into the groove; attaching the lid having the grooves and dam to the substrate via a sealant such that the TIM is in contact with the surface of the grooves of the lid so as to prevent the TIM from melting and flowing down the semiconductor chip.

According to the present invention, the dam of the semiconductor package is capable of preventing a TIM, which is formed between a semiconductor chip and a lid, from melting and flowing down the semiconductor chip at high temperature. Therefore, the performance of the semiconductor package does not deteriorate at high temperature.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

The present invention now will be described more fully with reference to the accompanying drawings, in which preferred embodiments of the invention are shown. This invention, however, may be embodied in many different forms and should not be construed as being limited to the embodiments set forth herein. Rather, the embodiments are provided so that its disclosure will be thorough and complete, and will fully convey the concept of the invention to those skilled in the art. In the present invention, a semiconductor package is not limited to a specific semiconductor package such as a land grid array (LGA) illustrated in the drawings. Rather, it can be any other semiconductor packages, in which the principles of the present invention can be applied. Also, a material such as thermosetting epoxy, which has unchangeable properties and shape below about 125° C., is used as a dam in the embodiments of the present invention as described herein, but the thermosetting epoxy can be replaced with any material which has excellent heat conductivity and the properties that do not change at a high temperature. The same reference numerals in different drawings represent the same or like elements, and thus, their description will be omitted for brevity.

First Embodiment

Figure 3:
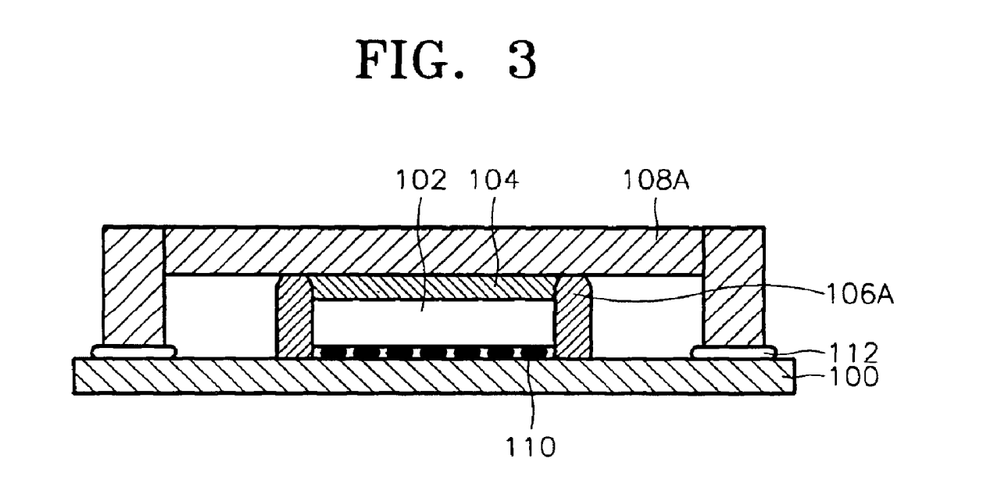
FIG. 3 is a cross-sectional view of a semiconductor package having a dam according to a first embodiment of the present invention.

FIG. 3 is a cross-sectional view of a semiconductor package having a darn 106A according to a first embodiment of the present invention. In detail, the semiconductor package of FIG. 1 includes a substrate 100; a semiconductor chip 102 attached to the semiconductor package 100 via a conductive bump such as a solder bump 110; a thermal interface material (TIM) 104 attached to the semiconductor chip 102; the dam 106A installed to be in contact with the TIM 104 so as to prevent the TIM 104 from flowing down if it becomes liquefied due to heat; and a lid 108A in contact with the top of the TIM 104 and encapsulating the semiconductor chip 102 and the dam 106A. The lid 108A is attached to the substrate 100 via a sealant 112. In the first embodiment, the dam 106A is formed on the substrate 100, in contact with the sides of the TIM 104 and the semiconductor chip 102, and a portion of the bottom of the lid 108A. The dam 106A, thus, substantially entirely surrounds the rectangle-shaped semiconductor chip 102 and TIM 104.

The substrate 100, similar to a ball grid array (BGA) package substrate, has bumps connection (not shown) to which the solder bump 110 of the semiconductor chip 102 can be attached on its top, and a land portion rack connection (not shown) to which a connector, installed in a printed circuit board (PCB), can be connected at its bottom. The substrate 100 is preferably one for a LGA.

Preferably, a bonding pad on the semiconductor chip 102 includes the solder bump 110. The TIM 104 may be a phase change material (PCM).

The dam 106A prevents the TIM 104, which is a PCM, from melting and flowing down between the lid 108A and the semiconductor chip 102. A thermosetting epoxy that does not liquefied below about 125° C. is used for the dam 106A according to an embodiment of the present invention. However, any other material that has excellent heat conductivity and is not liquefied at about 125° C. or the like can be used as the dam 106A.

The lid 108A is preferably formed of metal, for example, an alloy of copper and nickel, and is attached to the substrate 100 by the sealant 112 so as to protect the semiconductor chip 102. The lid can be formed of any other suitable materials for application of the present invention.

Second Embodiment

Figure 4:
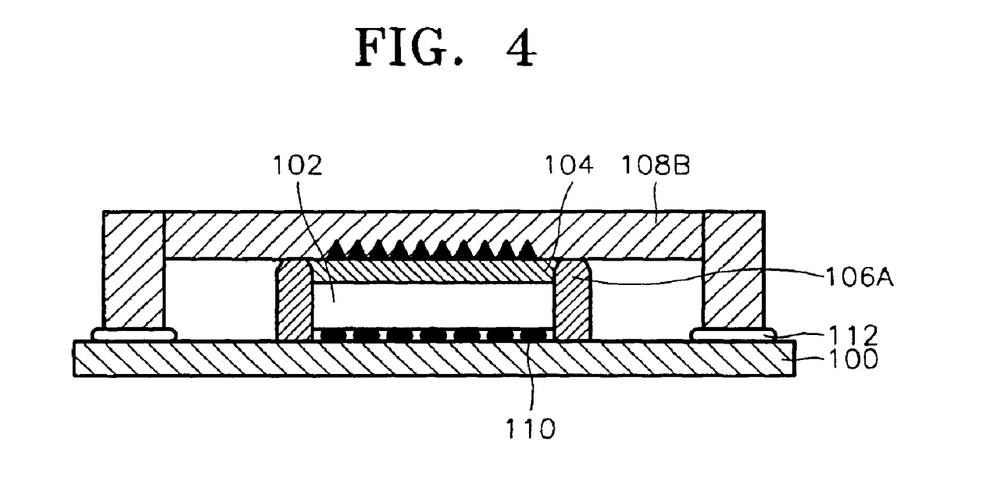
FIG. 4 is a cross-sectional view of a semiconductor package having a dam according to a second embodiment of the present invention.

FIG. 4 is a cross-sectional view of a semiconductor package including dam 106A according to a second embodiment. Referring to FIG. 4, the bottom of a lid 108B is processed to have irregularities, e.g., square, triangle or hemispherical-shaped irregularities, at its bottom. Due to the irregularities, an area where the lid 108B and the TIM 104 are in contact with each other can be increased. Thus, the semiconductor package effectively discharges heat, generated by the operation of the semiconductor chip 102, to the outside via the TIM 104 and the lid 108B. Further, the TIM 104 and the lid 108B can be more firmly bonded with each other through the irregularities. In addition, the same effect can be obtained by forming irregularities on the back side of the semiconductor chip 102, opposite the active surface of the chip on which the solder bumps 110 are placed.

Third Embodiment

Figure 5:
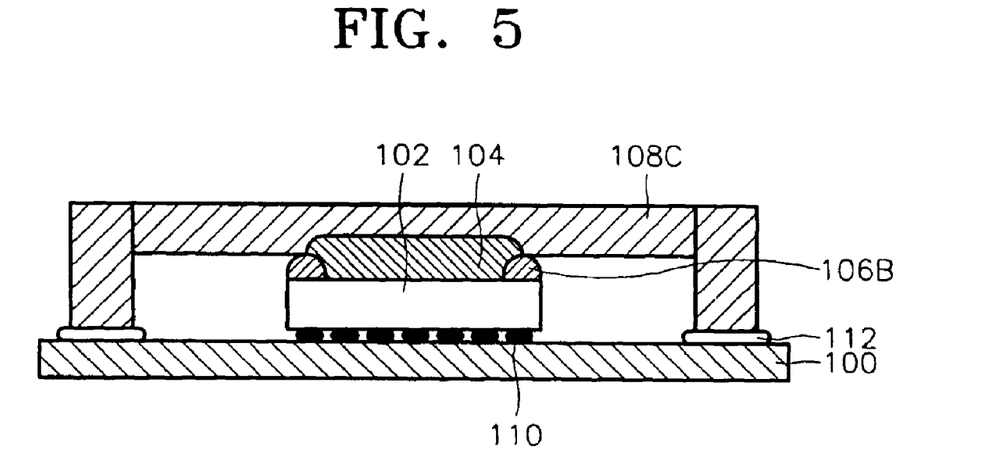
FIG. 5 is a cross-sectional view of a semiconductor package having a dam according to a third embodiment of the present invention.

FIG. 5 is a cross-sectional view of a semiconductor package having a dam 106B according to a third embodiment. Referring to FIG. 5, the dam 106B is formed on a semiconductor chip 102 to prevent a TIM 104 from melting and flowing down. In contrast, the dams 106A in FIGS. 3 and 4 are in contact with the sides of the TIM 104 and the semiconductor chip 102. Also, the bottom of a lid 108C is processed to have a comparatively hemispherical-type irregularity. However, the irregularity may be omitted on the bottom of the lid 108C.

Fourth Embodiment

Figure 6:
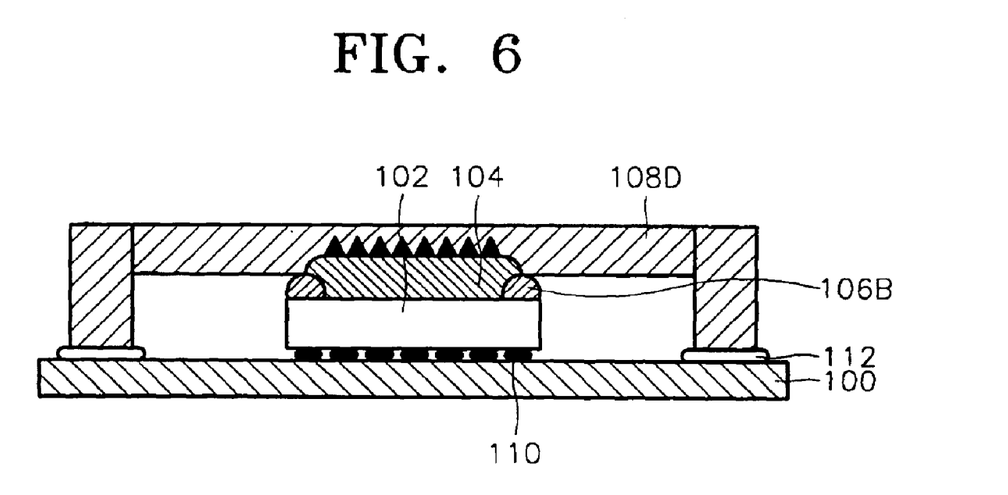
FIG. 6 is a cross-sectional view of a semiconductor package having a dam according to a fourth embodiment of the present invention.

FIG. 6 is a cross-sectional view of a semiconductor package including a dam 106B according to a fourth embodiment. The fourth embodiment is a modified from the semiconductor package (FIG. 5) according to the third embodiment in which the dam 106B are formed on the semiconductor chip 102. In the fourth embodiment, the bottom of a lid 108D having the substantially hemispherical-type irregularity is additionally processed to have triangle-type irregularities, as shown in FIG. 6. Because the lid 108D has both the hemispherical-shaped and triangle-shaped irregularities, heat generated from the semiconductor chip 102 can be more effectively discharged and the TIM 104 can be more firmly attached to the lid 108B.

Fifth Embodiment

Figure 7:
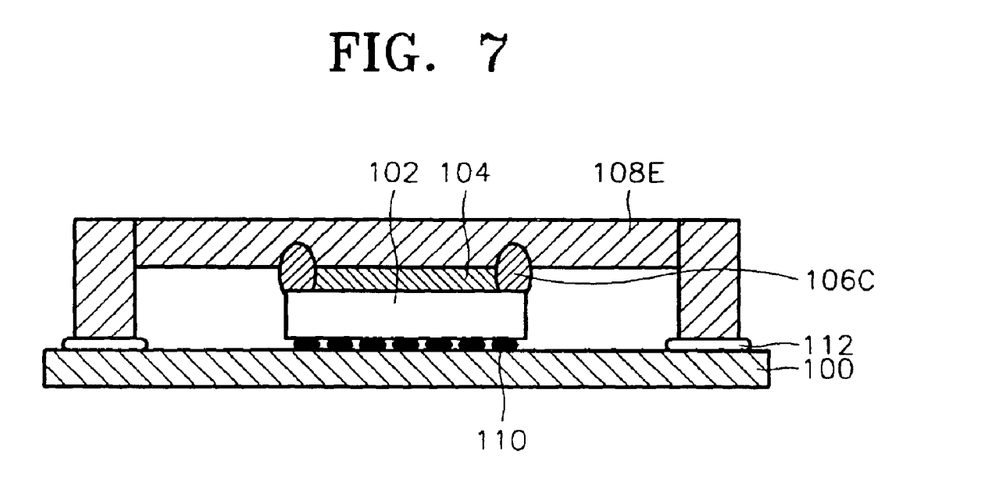
FIG. 7 is a cross-sectional view of a semiconductor package having a dam according to a fifth embodiment of the present invention.

FIG. 7 is a cross-sectional view of a semiconductor package including a dam 106C according to a fifth embodiment of the present invention. The semiconductor package of FIG. 7 is a modified from the semiconductor package according to the third embedment shown in FIG. 5. In the fifth embodiment, a TIM 104 can be also effectively sealed by the dam 106C, among others, with the dam 106C and a lid 108E having irregularities modified from the irregularities of the lid 108C of FIG. 5. Further, the height of the dam 106C is higher than that of the TIM 104, thus forming gaps in the dam 106C. The gaps prevent the TIM 104 from flowing down from the semiconductor chip 102 at high temperatures. Once the dam 106C is formed higher than the TIM 104, it may not matter whether hemispherical-shaped irregularities of the lid 108E are entirely filled with the dam 106C or not.

Sixth Embodiment

Figure 8:
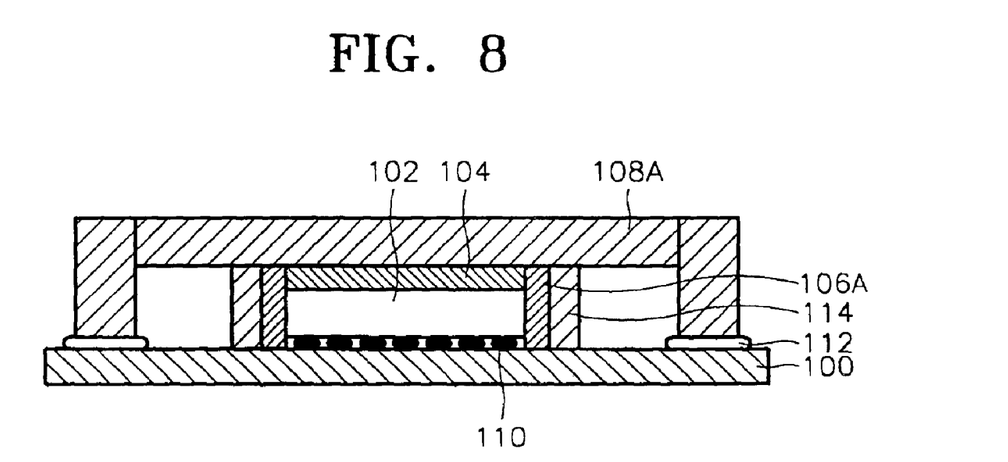
FIG. 8 is a cross-sectional view of a semiconductor package having a dam according to a sixth embodiment of the present invention.

FIG. 8 is a cross-sectional view of a semiconductor package including a dam 108A according to a sixth embodiment of the present invention. The semiconductor package of FIG. 8 is modified from the semiconductor package of FIG. 3 according to the first embodiment. Referring to FIG. 8, a lid 108A further includes a supporter 114 that supports the dam 106A by enveloping the sides of the dam 106A. The supporter 114 may be bonded with a substrate 100 by a sealant 112 if necessary.

Hereinafter, a method for fabricating semiconductor packages including a dam according to the first through sixth embodiments will now be described. First, a substrate having a land at its bottom and bump connectors at its top is prepared. Then, a semiconductor chip is attached to the substrate by connecting bumps of the semiconductor chip to the bump connectors. Thereafter, a dam is formed on the resultant structure. Next, a TIM is formed on the resultant structure having the dam, and then, a lid is attached to the resultant having the TIM via a sealant. The lid may be processed to have irregularities or have a supporter at its sides.

In the above method, the dam is formed after the TIM is formed. However, the TIM may be formed prior to forming the dam.

Seventh Embodiment

Figure 9:
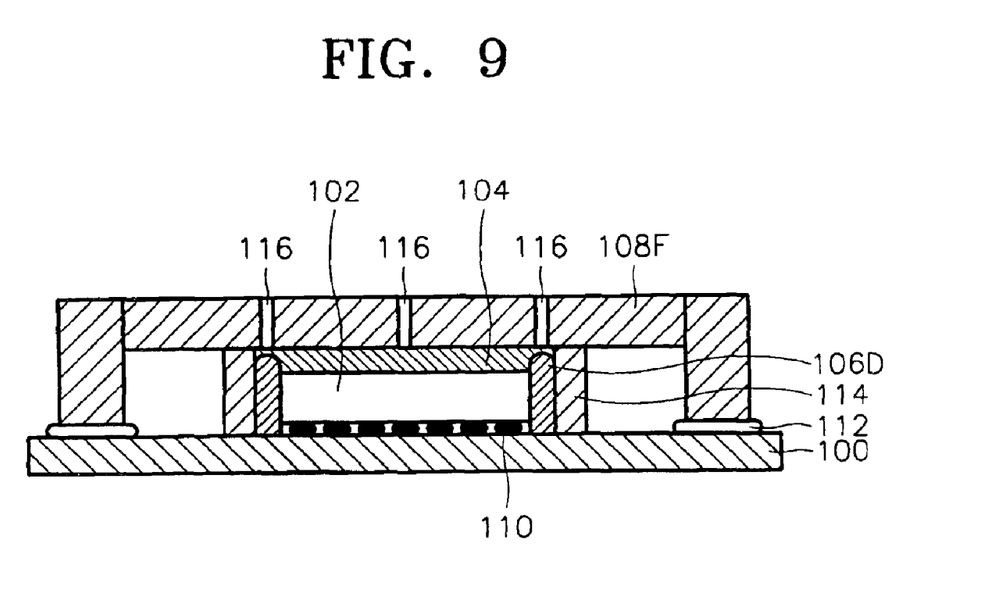
FIG. 9 is a cross-sectional view of a semiconductor package having a dam according to a seventh embodiment of the present invention.

FIG. 9 is a cross-sectional view of a semiconductor package including a dam 106D according to a seventh embodiment of the present invention. The semiconductor package is modified from the semiconductor package of FIG. 8 according to the sixth embodiment, and further includes injection holes 116 in a lid 108F, through which materials required for forming the dam 106D and a TIM 104 are injected.

A method for fabricating the semiconductor package including the dam 106D will now be described. First, a substrate 100 is prepared and a semiconductor chip 102 is attached to the substrate 100 by connecting bumps of the semiconductor chip 102 to solder bumps 110 of the substrate 100. Then, the lid 108E that has the injection holes 116 and is supported by a supporter 114 is bonded with the substrate 100 via a sealant 112 to seal up the semiconductor chip 102. Next, a liquid material for forming the dam 106D is injected through edge injection holes 116 of the lid 108F and then a liquid PCM is injected through center injection holes 116 of the lid 108F to form the TIM 104. The shape of the dam 106D and the TIM 104 may be modified in various ways depending on applications.

Eighth Embodiment

Figure 10:
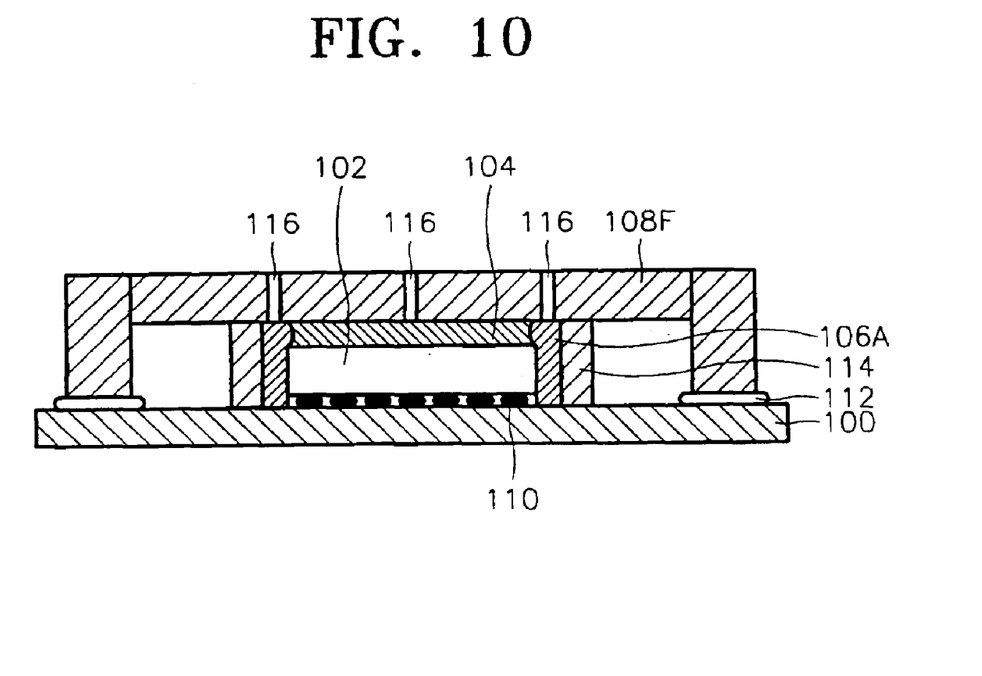
FIG. 10 is a cross-sectional view of a semiconductor package having a dam according to an eighth embodiment of the present invention.

FIG. 10 is a cross-sectional view of a semiconductor package including a dam 106A according to an eighth embodiment of the present invention. The semiconductor package of FIG. 10 is a modified from the semiconductor package of FIG. 9 according to the seventh embodiment, but a manufacturing process is substantially the same as that of the seventh embodiment, except that a TIM 104 is formed, and then, the dam 106A is formed.

Ninth Embodiment

Figure 11:
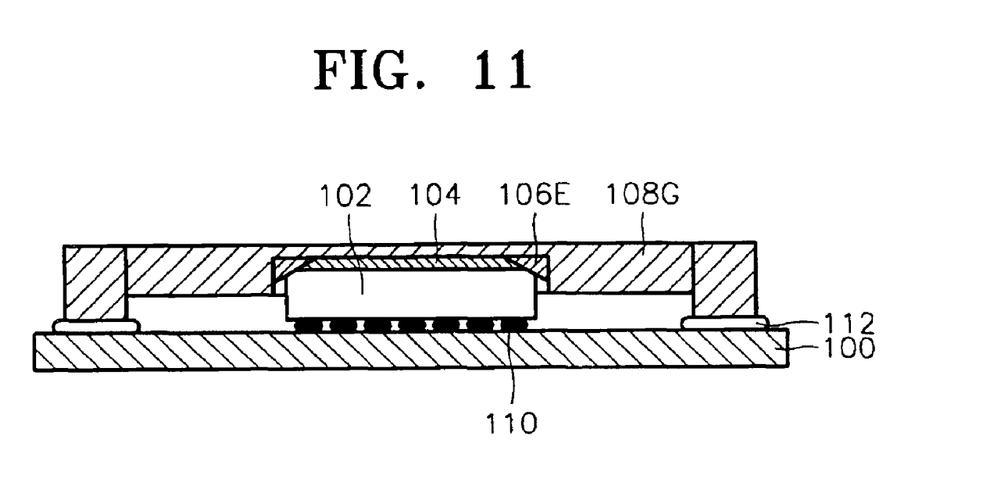
FIG. 11 is a cross-sectional view of a semiconductor package having a dam according to a ninth embodiment of the present invention.

FIG. 11 is a cross-sectional view of a semiconductor package including a dam 106E according to a ninth embodiment of the present invention. The semiconductor package of FIG. 11 includes a substrate 100 having a land at its bottom and bump connectors at its top; a semiconductor chip 102 attached to the substrate via solder bumps 110; a TIM 104 attached to the semiconductor chip 102; a lid 108G that is in contact with the top of the TIM 104, attached to the substrate 100 via a sealant 112, sealing up the semiconductor chip 102 and a dam 106E. The lid 108G has a recess at its bottom. The dam 106E is formed along the periphery of the recess and is in contact with the TIM 104. It is possible to more firmly seal up the TIM 104 if the dam 106E is formed of an elastomer.

In order to fabricate the semiconductor package of FIG. 11, the substrate 100 is prepared and the semiconductor chip 102 having solder bumps 110 is attached to the substrate 100. Next, a TIM 104 is formed on the semiconductor chip 102. Then, the bottom of the lid 108G is processed to have a square-shaped recess. Due to the recess, portions of the TIM 104 and the semiconductor chip 102 can be inserted into the lid 108G. Then, the dam 106E, which is formed of an elastomer, is inserted into the groove of the lid 108G. Lastly, the lid 108G is attached to the substrate 100 via a sealant 112 so as to seal up the semiconductor chip 102. The dam 106E according to the ninth embodiment can be manufactured more simply than the dam A through D according to the first through eighth embodiments.

Figure 12:
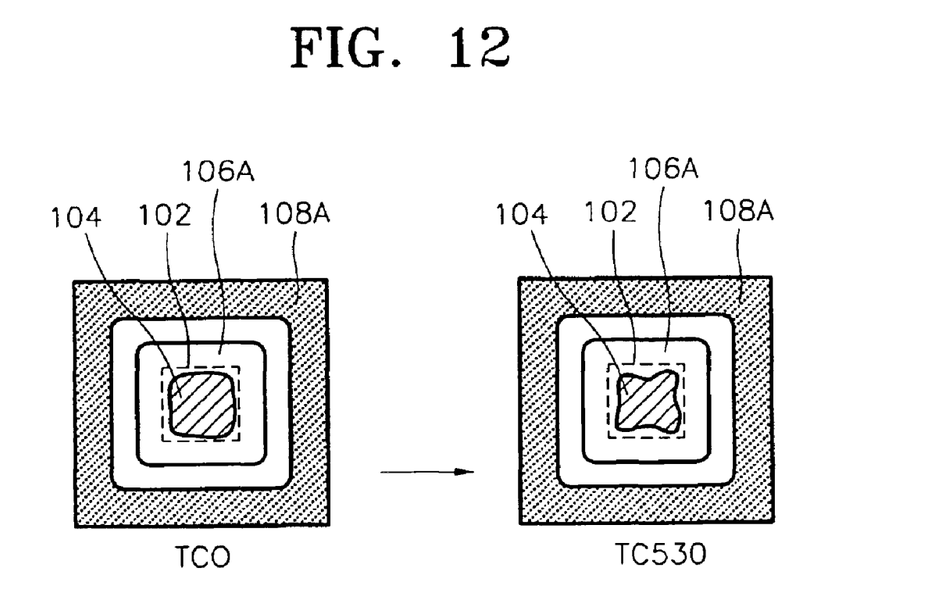
FIG. 12 is plan views for explaining the effects of a semiconductor package having a dam according to the present invention.

FIG. 12 is plan views for explaining the effects of the semiconductor package including a dam according to embodiments of the present invention. In FIG. 12, the illustration on the left is a plan view of a semiconductor package on which a temperature cycling test has not yet performed, taken by an ultra-sonograph. The illustration on the right is a plan view of a semiconductor package on which a temperature cycling test was performed 530 times, taken by an ultra-sonograph. Referring to FIG. 12, it should be noted that a dam 106A are formed to encompass a TIM 104, and thus, the TIM 104 is still placed between the semiconductor chip 102 and the lid 108A at high temperatures even after the temperature cycling test. Here, the dam 106A is formed of a thermosetting epoxy.

As described above, a semiconductor package according to the present invention employs a dam to solve the problem of conventional semiconductor packages that a TIM melts and flows down a semiconductor chip at high temperatures, thus deteriorating the heat conductivity of the semiconductor package.

What is claimed is:

1. A semiconductor package comprising:
   a package substrate;
   a semiconductor chip attached to the substrate;
   a TIM formed on the semiconductor chip;
   a dam that substantially surrounds the TIM; and
   a lid placed over the TIM to contact a surface thereof, wherein the dam is formed on the substrate and in contact with the sides of the TIM and the semiconductor chip, wherein the lid further comprises a supporter for supporting the dam, and wherein the lid comprises injection holes through which materials required to form the dam and TIM are injected.

2. The semiconductor package of claim 1, wherein the lid is attached to the substrate via a sealant and covers the semiconductor chip and the dam.

3. The semiconductor package of claim 1, wherein the dam is formed of a material that is not liquefied at least below about 125° C.

4. The semiconductor package of claim 3, wherein the material that is not liquefied below about 125° C. comprises a thermosetting epoxy.

5. The semiconductor package of claim 1, wherein the injection holes comprise a first hole and a second hole, the first hole overlying the dam, the second hole overlying substantially the center portion of the TIM.

* * * * *